US005523914A

United States Patent [19]

Weck et al.

[11] Patent Number: 5,523,914

[45] Date of Patent: Jun. 4, 1996

[54] INDUCTIVE SUPERCONDUCTING CURRENT STORAGE

[75] Inventors: Werner Weck, Starnberg; Hermann Schölderle, Aidenried; Peter Ehrhart, Munich, all of Germany

[73] Assignee: Magnet-Motor Gesellschaft für Magnetomotorisch Technik mbH, Starnberg, Germany

[21] Appl. No.: 117,040

[22] PCT Filed: Mar. 4, 1992

[86] PCT No.: PCT/EP92/00472

§ 371 Date: Sep. 6, 1994

§ 102(e) Date: Sep. 6, 1994

[87] PCT Pub. No.: WO92/15999

PCT Pub. Date: Sep. 17, 1992

[30] Foreign Application Priority Data

Mar. 4, 1991 [DE] Germany .......................... 41 06 859.9

[51] Int. Cl.[6] .............................. G01R 33/20; H01F 7/22

[52] U.S. Cl. .......................... 361/141; 335/216; 505/211; 323/360

[58] Field of Search .................................... 335/216, 301; 324/318, 319, 320; 361/19, 141; 323/360; 505/211, 850, 851, 869, 879

[56] References Cited

U.S. PATENT DOCUMENTS

| | | | |
|---|---|---|---|
| 4,622,531 | 11/1986 | Eyssa et al. | 335/216 |
| 4,851,958 | 7/1989 | Takechi | 361/141 |
| 4,926,289 | 5/1990 | Reichert | 361/141 |
| 4,962,354 | 10/1990 | Visswer et al. | 323/360 |
| 5,146,383 | 9/1992 | Logan | 361/19 |
| 5,225,957 | 7/1993 | Tsurunaga | 361/19 |

*Primary Examiner*—Gregory D. Thompson
*Assistant Examiner*—Raymond M. Barrera
*Attorney, Agent, or Firm*—Spencer & Frank

[57] ABSTRACT

An inductive superconducting current storage (2), characterized in that it comprises an inner coil (4) wound from superconducting material and an outer coil (6) wound from superconducting material and disposed around the inner coil (4) in spaced manner therefrom, said inner coil (4) and said outer coil (6) in operation having current flowing therethrough in opposite directions so that the same magnetic flux as in the inner space (14) of the inner coil (4), but of opposite direction, is present in the annular space (12) between inner coil (4) and outer coil (6).

17 Claims, 4 Drawing Sheets

INDUCTIVE SUPERCONDUCTING CURRENT STORAGE

Subject matter of the invention is an inductive superconducting current storage, characterized in that it comprises an inner coil wound from superconducting material and an outer coil wound from superconducting material and disposed around the inner coil in spaced manner therefrom, said inner coil and said outer coil in operation having current flowing therethrough in opposite directions so that the same magnetic flux as in the inner space of the inner coil, but of opposite direction, is present in the annular space between inner coil and outer coil.

Inductive superconducting current storages or accumulators having a cylindrical coil as most essential component are known. With such current storages the magnetic field present in the inner space of the coil passes outwardly at the two coil ends and is closed outside of the coil so that a magnetic field having as a rule a very high magnetic field strength is present in the vicinity of the coil.

In the current storage according to the invention, the magnetic circuit in contrast thereto extends in a first axial direction through the inner space of the inner coil and then extends in the opposite, second axial direction through the annular space between inner coil and outer coil so that—apart from portions close to the two face ends of the coil assembly—there is virtually no magnetic field outside of the coil assembly. The magnetic field is compensated or fed back in the coil assembly.

The term "superconducting material" on the one hand refers to as a rule metallic materials which are superconductive only at temperatures very little above absolute zero and which have been known for quite some time. On the other hand, this term also applies to the mostly ceramic materials which are still superconducting at a considerable distance in temperature from absolute zero and which have been known for a few years only. These materials often are called high-temperature superconductors, with the temperature of liquid nitrogen being usable as classification limit; according to this classification, high-temperature superconductors are superconductors which are still superconducting at least at the boiling temperature of liquid nitrogen.

The windings of the inner and outer coils as well as the magnetic flux cross-sections of the annular space and the inner space preferably are designed such that at least substantially the same magnetic flux densities result in the annular space and in the inner space. This holds also for the circumferences of inner coil and outer coil. The superconducting material of the two coils may be put to practical use at all locations.

The inner coil and the outer coil usually form part of a common storage circuit. For being able to (completely or partly) discharge the storage circuit, the storage circuit preferably is connected to a load circuit. According to a particularly preferred development of the invention, the storage circuit has a discharge switch means composed with superconducting material and adapted to be brought into a high-resistance, normally conducting state for interrupting the storage circuit and thus discharging the current storage via the load circuit. Switches composed with superconducting material are known per se, just as means for bringing the switch into a high-resistance, normally conducting state for opening the switch, which may be for example a heating means, a means for applying high-energy radiation to the switch (high-frequency radiation, laser radiation, etc.), a means for applying a current pulse of high current intensity to the superconducting material of the switch. The latter is particularly preferred in the current storage according to the invention, in particular in an embodiment in which the current pulse is generated by discharge of a capacitor or several capacitors.

Further preferred features of the invention are indicated in claims 4 to 18 and will be elucidated in more detail further below in conjunction with the description of further preferred embodiments. It is pointed out that the features indicated in the individual dependent claims in part can be realized in technically sensible manner also alone, i.e. without incorporation of the features at least of claim 1, and have an inventive significance of their own. This holds in particular for those features which are indicated in claims 4, 5, 6, 10, 12, 13, 14, 15, 16.

The invention and developments of the invention will be elucidated in more detail hereinafter on the basis of embodiments shown partly schematically in the drawings in which FIG. 1 shows a schematic axial sectional view illustrating the geometric arrangement of essential parts of a current storage;

Figure 2:
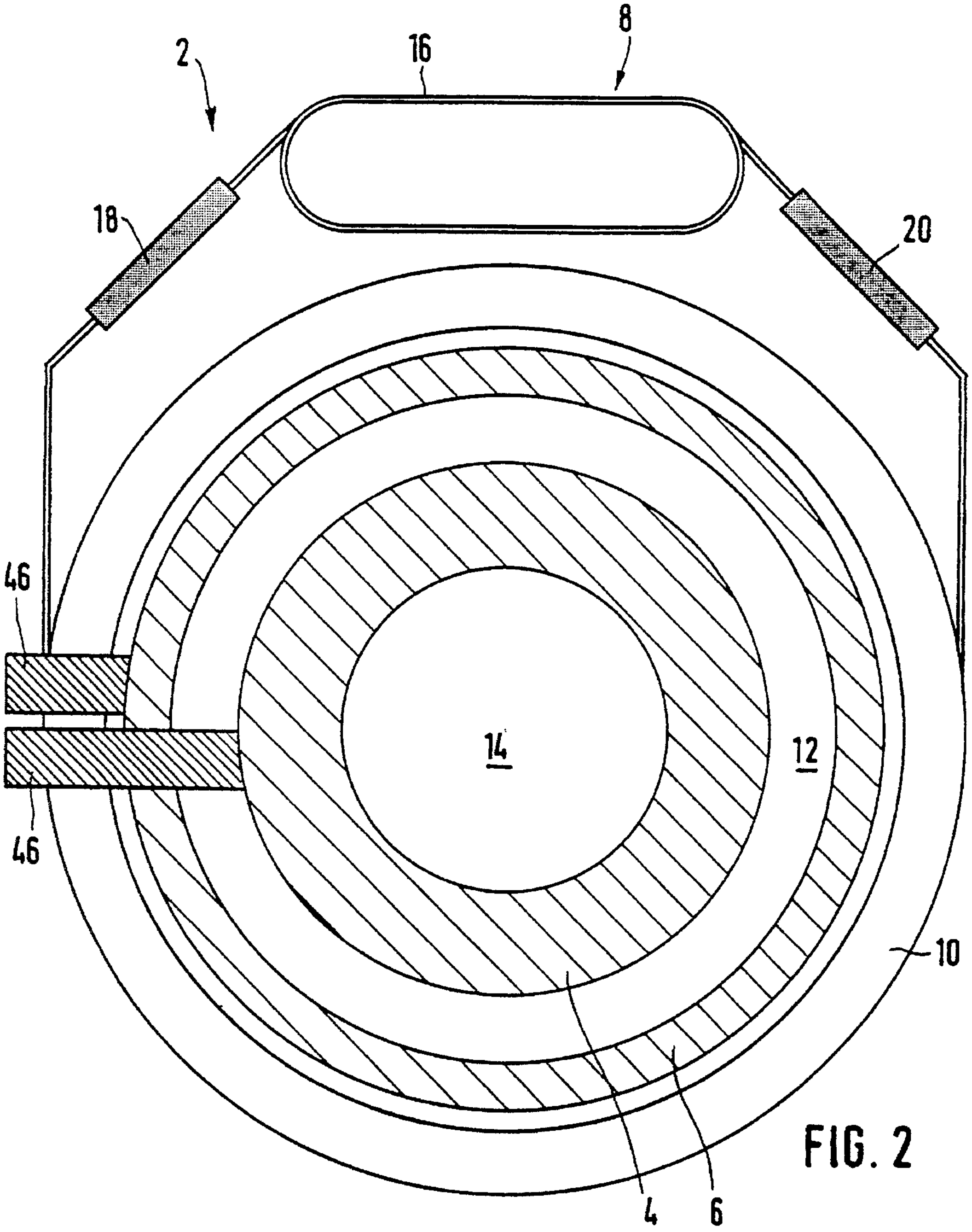
FIG. 2 shows a schematic plan view of the current storage according to FIG. 1, with a means for inductive charging of the current storage being illustrated in addition.
Figure 1:
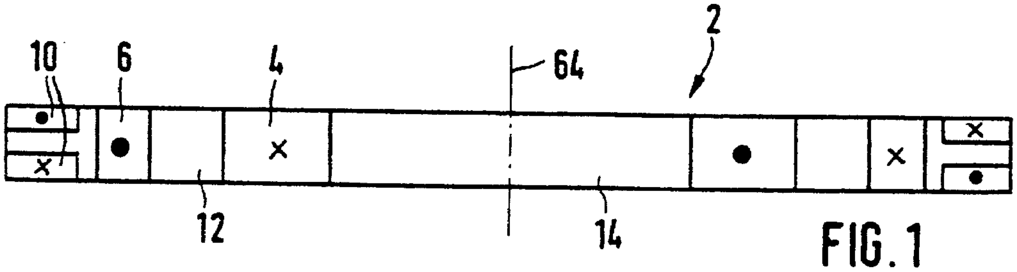

The current storage 2 according to FIGS. 1 and 2 consists in essence of a practically cylindrical inner coil 4 of superconducting material, a practically cylindrical outer coil 6 of superconducting material concentrically aligned with said inner coil 4, a means 8 for inductive charging of the coils 4 and 6, and a discharge switch means 10. The inner coil 4 is wound in a first winding direction, while the outer coil 6 is wound in the opposite winding direction. The annular space 12 between outer coil 6 and inner coil 4 has a magnetic flux cross-section in the form of a circular ring (visible in the plan view of FIG. 2), which in its cross-sectional area substantially corresponds to the circular (as visible in the plan view of FIG. 2) magnetic flux cross-section of the inner space 14 of the inner coil 4. The inner coil 4 and the outer coil 6 have substantially the same number of windings and are electrically connected in series such that in operation current flows through them in opposite directions. In case the two coils 4 and 6 are not wound in opposite directions, this effect may also be achieved by a corresponding connection of inner coil 4 and outer coil 6.

The inner coil 4 and the outer coil 6 preferably are substantially of the same axial length and aligned with each other at their two axial ends.

The charging means 8 consists substantially of a primary coil and a secondary coil means shown in FIG. 2 as a uniform assembly 16, and of two charging switches 18, 20, through which the secondary coil means is connected to a storage circuit. More detailed statements in this respect will be made further below in connection with FIG. 3. The primary coil, the secondary coil means, the connections between the secondary coil means and the two charging switches 18, 20, the two charging switches 18, 20 and the connections between the charging switches 18, 20 and the discharge switch means 10 are composed with superconducting material.

The discharge switch means 10 consists substantially of a coil wound from superconducting material in two strands or branches, the discharge switch means 10 thereby having a great superconducting material length. The discharge switch means 10 is disposed around the outer coil 6 with a small distance therefrom while being arranged concentrically with respect to inner coil 4 and outer coil 6. The discharge switch means 10 is electrically connected on the one hand to the charging means 8 and on the other hand to the outer coil 6 and to the inner coil 4, such that current flows in opposite directions through the two winding strands of the switch coil. More detailed statements in this respect will be made further below in connection with FIG. 3. The switch coil to thus is closely integrated with the assembly of inner coil 4 and outer coil 6, but is located in the space radially outside of the outer coil 6, with said space being virtually free from a magnetic field. The two-strand winding structure of the switch coil 10, through which current flows in opposite directions, has the effect that the switch means as a whole is of low inductance. There is virtually no effect of the magnetic field of the storage coil assembly on the discharge switch means and vice versa.

Figure 3:
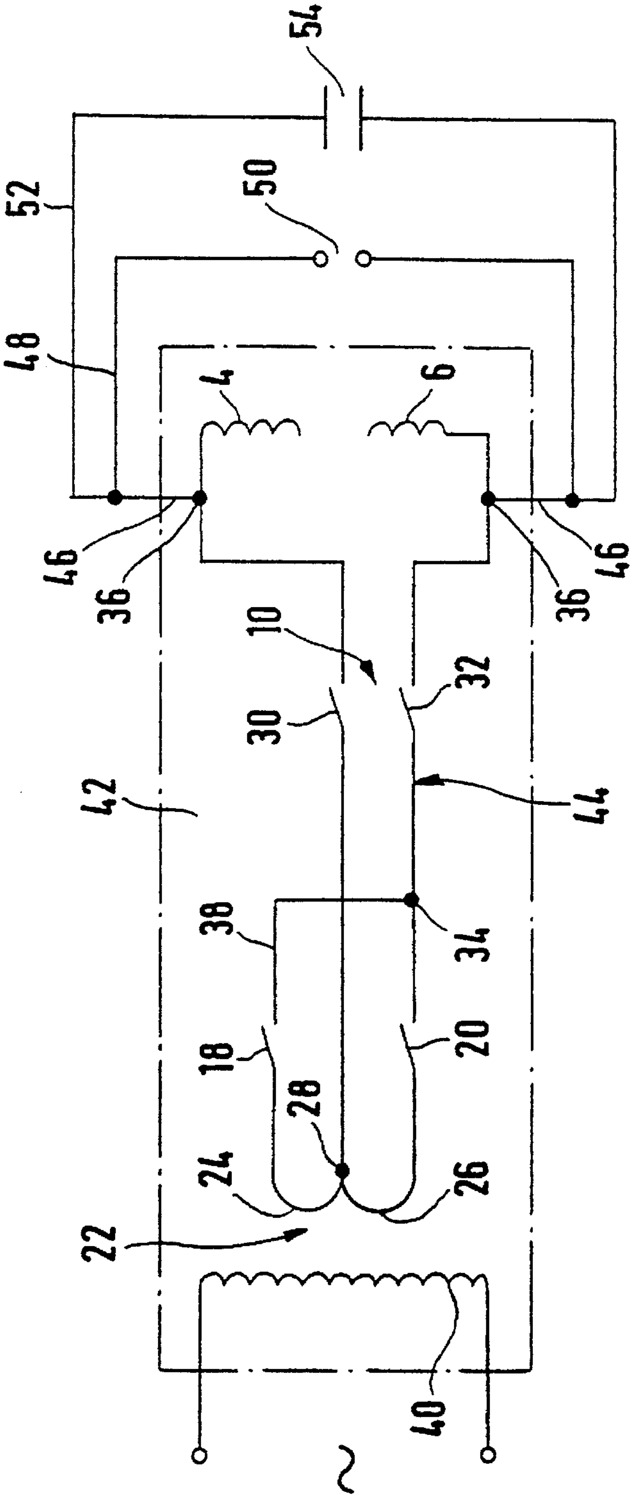
FIG. 3 shows a block diagram of the current storage of FIGS. 1 and 2.

FIG. 3 illustrates the electrical connection of the components of the current storage 2 described so far. It can be seen that the inner coil 4 and the outer coil 6 are electrically connected in series, that the charging secondary coil means has a first secondary coil 24 and a second secondary coil 26 (centrally connected with each other), that an electrical connection exists from the connecting point 28 of the two charging secondary coils 24, 26 via a first discharge switch 30 to one end of the inner coil 4, and that an electrical connection to the outer coil 6 exists between the free ends of the charging secondary coils 26 and 26 via the charging switches 18, 20 and a second discharge switch 32. All components and electrical connections described now in connection with FIG. 3 consist electrically of superconducting material, in the form of a continuous superconducting material strand containing only the connecting point 28 between the two charging secondary coils 24, 26 and the connecting points 34 and 36 still to be described hereinafter.

The first discharge switch 30 is constituted by one winding strand of the discharge switch means 10, and the second discharge switch 32 is constituted by the second winding strand of the discharge switch means 10, with the first discharge switch 30 and the second discharge switch 32 being spatially combined so as to form a common discharge switch coil.

FIG. 3 shows furthermore that the upper end of the first charging secondary coil 24 is connected via an electrical connection 38 to a connecting point 34 located in the electrical connection between the lower end of the second charging secondary coil 26 and the outer coil 6, to be precise between the second charging switch 20 and the second discharge switch 32. The first charging switch 18 is located in the connection 38. The two secondary coils 24 and 26 inductively cooperate with the charging primary coil 40 which also consists of superconducting material and is fed with alternating current for charging the current storage 2. All components of the current storage 2 described so far in conjunction with FIG. 3 are located in a common cryogenic portion 42 disposed within the dot-dash line shown in FIG. 3.

The charging primary coil 40 as an alternative may be wound form normally conducting material and be disposed outside of the cryogenic portion 42.

The alternating current flowing in the charging primary coil 40 induces in the two charging secondary coils 24 and 26 voltages of periodically alternating sign. The charging switches 18 and 20 are opened and closed in correspondingly alternating manner, so that alternatingly either the first charging secondary coil 24 or the second charging secondary coil 26 is switched into the storage circuit 44 and feeds a charging current pulse thereto with the correct sign. The storage circuit 44 thus extends from the upper end of the inner coil 4 via the first discharge switch 30, then either via the first charging secondary coil 24 and the closed first charging switch 18 or via the second charging secondary coil 26 and the closed second charging switch 20 to the connecting point 34, from there via the second discharge switch 32 to the lower end of the outer coil 6, and finally from the upper end of the outer coil 6 to the lower end of the inner coil 4. It is to be understood that, during times in which the storage circuit 44 is not recharged, only one of the two charging switches 18, 20 is closed and the other one of the two charging switches 18, 20 is open and that, during times in which the storage circuit 44 is not discharged, the two discharge switches 30, 32 are closed.

The statements made hereinbefore in connection with the means for opening the discharge switch means 10 composed with superconducting material holds analogously for the two charging switches 18, 20. The switching capacity to be handled by each charging switch 18, 20 is considerably lower than the switching capacity to be handled by the discharge switch means 10, so that the charging switches 18, 20 can be of less complex and smaller construction than the discharge switch means 10. Furthermore, the switching sequence of the charging switches 18, 20 can be designed such that the charging switches 18, 20 open and close in a virtually current-free state.

As an alternative thereto it is also possible to utilize only one charging secondary coil and only one charging switch (half-wave charging means).

In the connection between the upper end of the inner coil 4 and the first discharge switch 30 there is provided a connecting point 38, and analogously thereto a connecting point 36 is provided in the connection between the lower end of the inner coil 6 and the second discharge switch 32. From each connecting point 36, a discharge terminal 46 or load terminal, as shown also in FIG. 2, extends outwardly from the cryogenic portion 42. Each discharge terminal 46, at least starting from the limit of said cryogenic portion 42, consists of normally conducting material. Following the discharge terminals 46 is a load circuit 48 having one or more current consumers or loads, not shown, disposed therein. The discharge terminals 46 furthermore have a circuit 52 with a capacitor 54 connected thereto.

For discharging the current storage 2, the capacitor 54 is caused to discharge so that a corresponding current pulse is fed to the storage circuit 44 (the current pulse does not flow via the load circuit 48 since the latter is in a high-resistance condition because of the current load 50). The current pulse is of such a magnitude that the superconductivity in the discharge switches 30, 32 collapses over a great length of the switch winding, which thereby obtain a high resistance. Consequently, the current stored in the now opened storage circuit 44 flows via the discharge circuit 48 through the current load or loads 50. For recharging the current storage 2, the discharge switches 30, 32 are closed again by being brought again into the superconducting state. It is pointed out that it is in principle sufficient to interrupt the storage circuit 44 only at one location for discharge.

As an alternative, the capacitor circuit 52 may be connected at different locations to the storage circuit 44, or a separate capacitor circuit 52 may be provided for each discharge switch 30, 32, which is connected upstream or downstream thereof. In the latter case, the connection may be such that, upon discharge of the capacitor 54, the closed one of the two charging switches 18, 20 is opened at the same time.

The term "cryogenic portion" 42 means that a temperature is present in this portion at which the superconducting material of the components and connections described is in the superconducting state. This is concretely e.g. a bath of liquid helium or liquid nitrogen. This bath is also present in the inner space 14 of the inner coil 4 and in the annular space 12 between inner coil 4 and outer coil 6.

It is pointed out that in the current storage according to FIGS. 1 to 3 the inner coil 4 and/or the outer coil 6 may each be composed of several partial coils which are disposed on top of each other and are electrically connected in series or parallel to each other.

Figure 4:
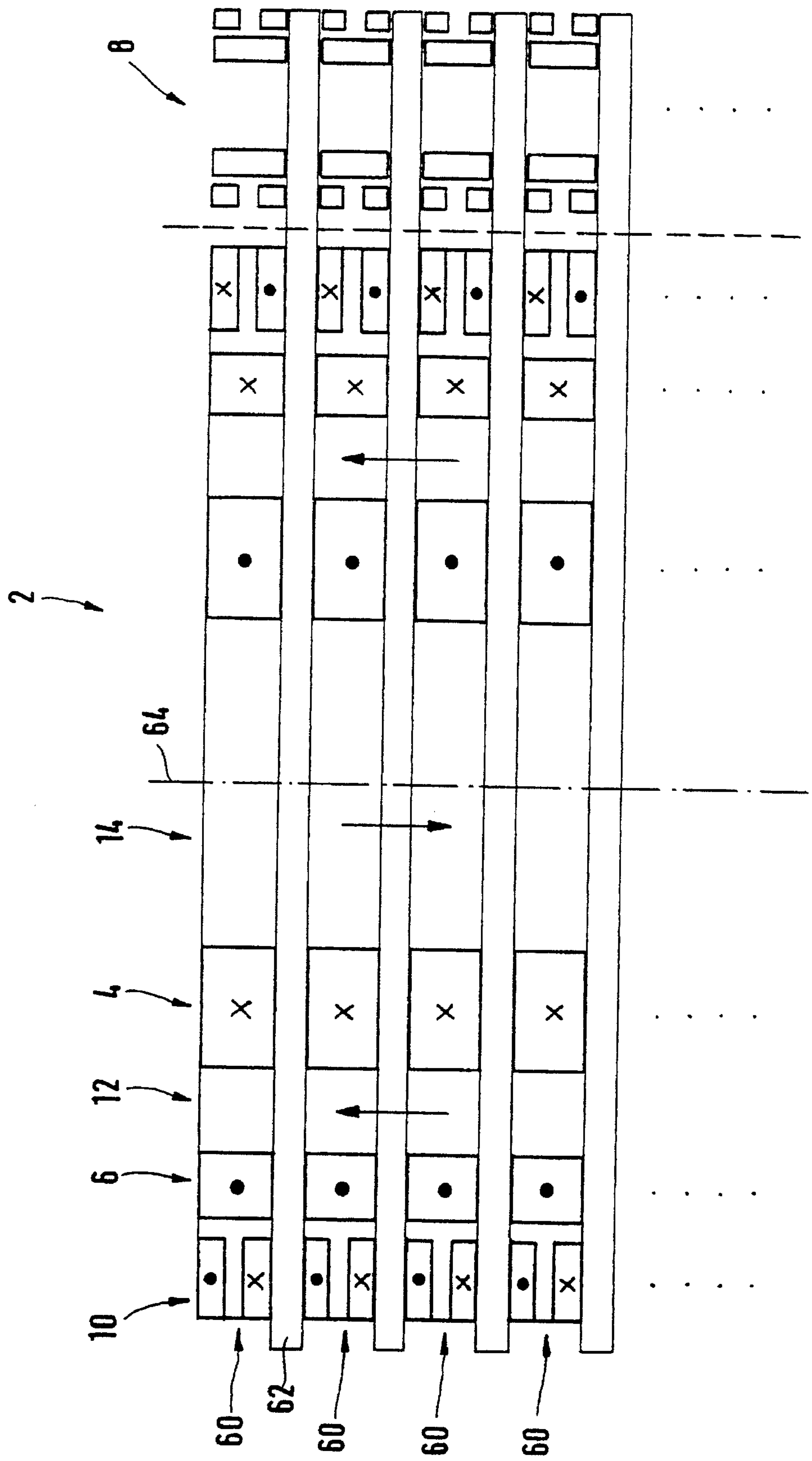
FIG. 4 shows an axial sectional view corresponding to that of FIG. 1 and illustrating a current storage composed of several partial current storages, with a means for inductive charging of the current storage being shown as well.

FIG. 4 shows an embodiment of a current storage 2 in which several partial current storages 60, each of a construction as described in FIGS. 1 to 3, are arranged on top of each other so as to form a stack. Each partial current storage 60 comprises a lower plate-like supporting member 62 of non-magnetizable material. An inductive charging means 8 provided for one particular current storage 60 each is shown as well. The partial current storages 60 are stacked onto each other such that the vertical central axes of the storage inner coils 4 coincide in one common axis 64. The same holds for the outer coils 6 and the discharge switch coils 10. The drawing shows furthermore that the magnetic field in the inner space 14 is on the whole directed from the top downwardly, whereas the magnetic field in the annular space 12 is on the whole directed from the bottom upwardly.

Figure 5:
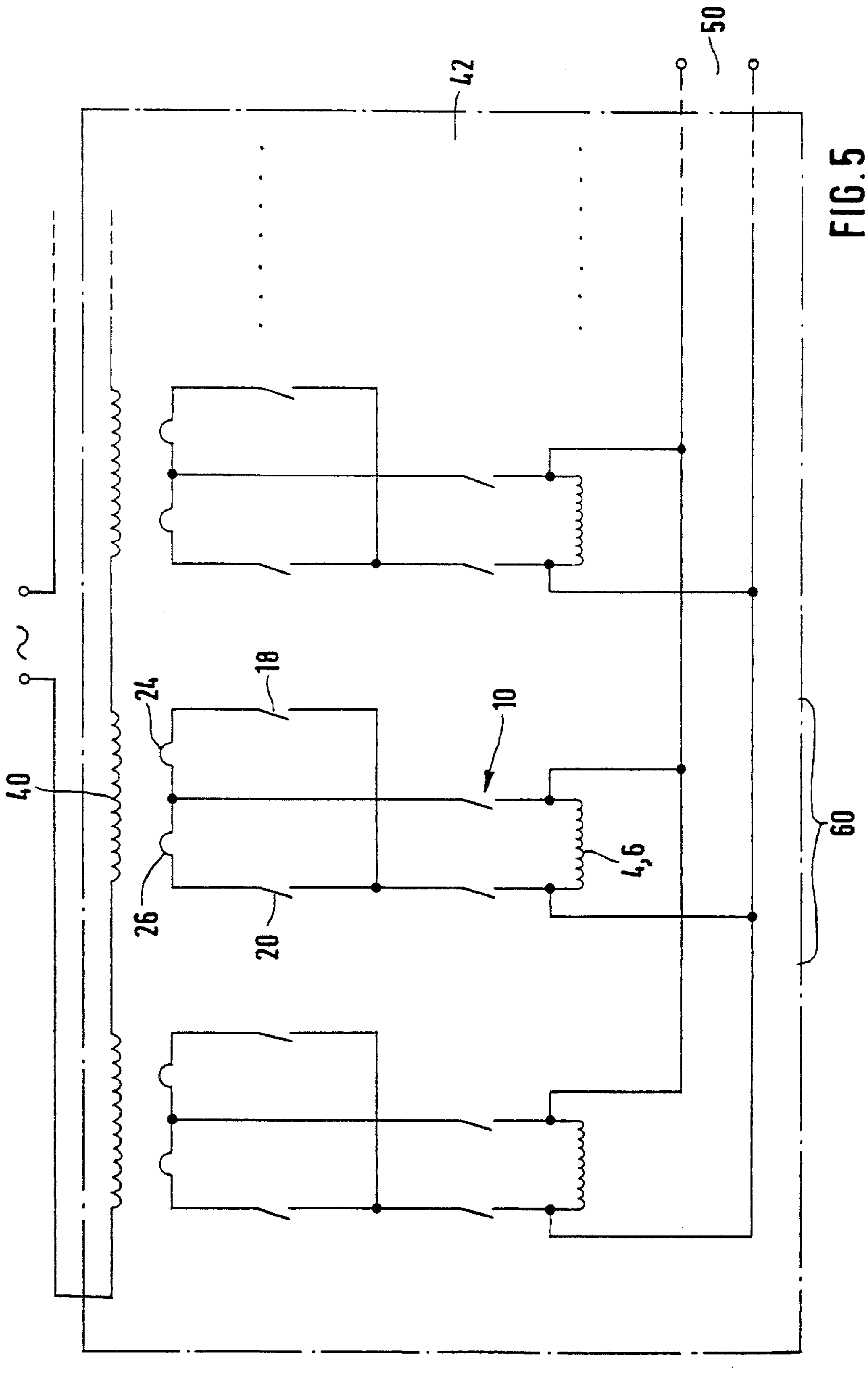
FIG. 5 shows a block diagram of the current storage of FIG. 4.

FIG. 5 shows that the components within each partial current storage 60 are interconnected in the same manner as in the current storage 2 according to FIGS. 1 to 3. One can see furthermore that the individual charging primary coils 40 are electrically connected in series. As an alternative thereto a common charging primary coil can be provided for all partial current storages 60. Finally, it can also be seen that the discharge terminals 46 of the individual storage circuits 44 are interconnected such that the storage coil pairs 4, 6 are as a whole connected in parallel to one or several loads 50, not shown.

Alternatively thereto it is possible to interconnect the load terminals 46 of the individual storage circuits 44 such that the storage coils 4, 6 as a whole are connected in series to the load or loads 50. The circuits 52 for applying a current pulse to the storage circuits 44 are not illustrated. It is remarked in general that the current direction in the various coils is marked by the symbols x for a first current direction and for the opposite current direction. Finally, it is pointed out that the annular space 12 between the inner coil or coils 4 and the outer coil or coils 6 may be also be filled e.g. with a plastics compound providing or supporting the structural integrity of the coils. Analogously thereto, the discharge switch coil 10 or the discharge coils 10 may also be combined with the outer coil or coils 6, respectively, by a plastics compound.

Figure 6:
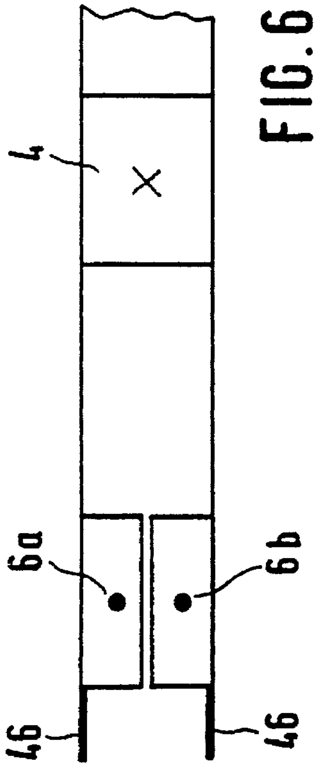
FIG. 6 shows a partial sectional view similar to FIG. 1, illustrating a modified coil design.

FIG. 6 illustrates a modified coil design. The outer coil 6 is divided in an upper outer coil **6*a* and a lower outer coil 6*b*. The upper outer coil 6*a* has a first terminal 46 at an upper, radially exterior location. A connection extends from the lower end of the upper partial outer coil 6*a* to the upper end of the inner coil 4. From the lower end of the inner coil 4, a connection extends to the upper end of the lower partial outer coil 6. A second terminal is provided at the lower end of the lower coil 6*b* at the radial outside thereof. There is thus no need to pass a terminal 46 at the top or bottom past the outer coil 6 to the inner coil 4. In case it is advantageous for reasons of winding technique, the inner coil 4** may be divided in an upper and a lower partial coil.

We claim:

1. An inductive superconducting current storage, comprising (a) an assembly of a plurality of coils wound from superconducting material and interconnected so as to form a storage circuit, (b) the storage circuit being connected to a load circuit and having a discharge switch means which is composed with superconducting material and which is brought to a high-resistance, normally conducting state for interrupting the storage circuit and thus for discharging the current storage into the load circuit, characterized in (c) that the storage circuit of the current storage comprises an inner coil wound from superconducting material and a outer coil wound from superconducting material and disposed around the inner coil in spaced manner therefrom, said inner coil and said outer coil in operation having current flowing therethrough in opposite directions so that the same magnetic flux as in the inner space of the inner coil, but of opposite direction, is present in the annular space between inner coil and outer coil.

2. A current storage according to claim 1, wherein the windings of the inner coil and the outer coil as well as the magnetic flux cross-sections of the annular space and of the inner space are designed such that at least substantially the same magnetic flux densities result in the annular space and the inner space.

3. A current storage according to claim 1, wherein the discharge switch means comprises a superconducting material section of great length wound in the manner of a coil.

4. A current storage according to claim 3, wherein the discharge switch means is disposed externally around the outside of the outer coil.

5. A current storage according to claim 3, wherein the discharge switch means is provided with two superconducting material sections of great length wound in coil-like manner in opposite directions.

6. A current storage according to claim 1, wherein the storage circuit comprises one discharge switch each at two locations.

7. A current storage according to claim 6, wherein the two discharge switches are combined to form the discharge switch means.

8. A current storage according to claim 1, wherein for inductive charging of the storage, a charging primary coil means and a charging secondary coil means cooperating therewith are provided in the storage circuit containing the inner coil and the outer coil.

9. A current storage according to claim 8, wherein the charging secondary coil means comprises two charging secondary coils which, via an interconnection of one charging switch each adapted to be opened and closed in intermittent manner, are connected to the storage circuit such that in both directions of current flow through the charging secondary coils are fed into the storage circuit with the correct sign.

10. A current storage according to claim 9, wherein the two charging switches are composed with superconducting material and for opening thereof are brought into a high-resistance, normally conducting state.

11. A current storage according to claim 1, wherein the storage inner coil, the storage outer coil, the discharge switch means, the charging secondary coil means and optionally the charging switch or switches, preferably also the charging primary coil, are commonly disposed in a cryogenic portion of the current storage.

12. A current storage according to claim 1, wherein the storage inner coil and the storage outer coil, preferably in addition thereto also the discharge switch means and/or the charging secondary coil means and/or one of the charging switches, are commonly composed of continuous superconducting material.

13. A current storage according to claim 1, wherein at least the outer coil is divided in two axially adjacent partial coils, and in that the current leads to the assembly of inner coil and outer coil are provided only from radially outside of the outer coil.

14. A current storage according to claim 1, wherein it consists of several partial current storages each comprising a storage inner coil, a storage outer coil, a discharge switch means and a charging secondary coil means optionally with charging switch(es), with a common charging primary coil being provided for the entire current storage or individual charging primary coils being provided for one partial current storage each.

15. A current storage according to claim 14, wherein the partial current storages are provided in a stack-like arrangement which is at least substantially aligned along a common axis of the storage inner coils.

16. A current storage according to claim 14, wherein the partial current storages are connected in series on the discharge side.

17. A current storage according to claim 14, wherein the partial current storages are connected in parallel on the discharge side.

* * * * *